United States Patent [19]
Bailey

[11] Patent Number: 5,408,192
[45] Date of Patent: Apr. 18, 1995

[54] MONOLITHIC BROADBAND PHASE SHIFTING CIRCUIT FOR ANALOG DATA SIGNALS

[75] Inventor: James A. Bailey, Tucson, Ariz.

[73] Assignee: International Business Machines Corporation, Armonk, N.Y.

[21] Appl. No.: 135,232

[22] Filed: Oct. 12, 1993

[51] Int. Cl.$^6$ ............................................. H03H 11/16
[52] U.S. Cl. .................................... 327/254; 327/255; 327/335; 327/99
[58] Field of Search ............... 307/262, 512, 553, 529; 328/24, 55, 151, 155, 142, 143, 14; 327/238, 254, 255, 335, 415, 416, 417

[56] References Cited

U.S. PATENT DOCUMENTS

| | | | |
|---|---|---|---|
| 2,905,837 | 9/1959 | Barry | 307/88.5 |
| 4,968,908 | 11/1990 | Walls | 307/529 |
| 5,051,702 | 9/1991 | Iwasaki | 328/155 |
| 5,332,975 | 7/1994 | Young et al. | 328/14 |

OTHER PUBLICATIONS

Carlos A. Laber & Paul R. Gray, *A 20-MHz Sixth-Order BiCMOS Parasitic-Insensitive Continuous-Time Filter and Second-Order Equalizer Optimized for Disk-Drive Read Channels*, IEEE Journal of Solid-State Circuits, vol. 28, No. 4, Apr. 1993, pp. 462–470.

Primary Examiner—Timothy P. Callahan
Assistant Examiner—Jeffrey Zweizig
Attorney, Agent, or Firm—Baker, Maxham, Jester & Meador

[57] ABSTRACT

An accurate phase shifting circuit providing two analog signals having a 90-degree phase shift between them from a single sampled-data input without the need for components external to a monolithic integrated circuit. A combination of two discrete-time circuits achieves the required 90-degree phase relationship over a broad frequency region. Several sample-and-hold circuits and multiplexors are used to produce two discrete-time versions of the analog input signal. Subtracting that older sample from the most-recent sample yields a forward difference signal and adding the most recent and the older samples produces a forward average signal. The phase difference between any single-frequency component of the forward difference and forward average signals is always 90 degrees. A pair of matched filters serves to reconstruct the sampled analog waveforms and to remove unwanted high-frequency noise in the +90° output signal.

12 Claims, 4 Drawing Sheets

MONOLITHIC BROADBAND PHASE SHIFTING CIRCUIT FOR ANALOG DATA SIGNALS

BACKGROUND OF THE INVENTION

1. Field of the Invention

This invention relates generally to analog signal differentiators for data detection in analog signals and, more specifically, to a sampled-time circuit for providing a precise 90-degree analog phase shift at all broadband analog signal frequencies suitable for process-independent monolithic implementation without external components.

2. Description of the Related Art

In the typical mass data storage device, digital data is stored in coded form as a sequence of signal transitions. Recovery of digital data from such storage requires read channel circuitry including means for accurate analog data signal peak detection. The analog data signal differentiator is a well-known element of analog data signal peak detectors. The precision analog differentiator provides the derivative of an analog data sense signal, which can also be understood as the 90-degree phase-shifted version of the analog data signal. That is, the derivative of an analog signal is merely an aggregate of the 90° shifted sinusoidal components at all frequencies over an operating band.

The art is replete with analog signal peak detectors and signal differentiator circuits but an accurate analog signal differentiator suitable for monolithic implementation without external components is thus far unknown in the art. For instance, FIG. 1 provides a functional block diagram of a 90-degree phase shifter (differentiator) 8 employing a pair of matched filters 10 and 12. The analog signal differentiator 8 shown in FIG. 1 requires components external to the integrated circuits for implementing the matched filters.

In FIG. 1, the reference phase output signal 14 is retarded 90 degrees in phase from the quadrature output signal 16 at all frequencies. Matched filters 10 and 12 have the following characteristics (in continuous-frequency form):

Filter 10: $H_1(s) = \dfrac{\omega_o}{s + \omega_o}$ [Eqn. 1]

Filter 12: $H_2(s) = \dfrac{s}{s + \omega_o}$ [Eqn. 2]

Thus, the resulting phase difference between the two output signals 14 and 16 is always 90 degrees at any frequency in the operating band. However, constructing filters 10 and 12 using only internal monolithic integrated circuit (IC) components introduces unacceptable variations in frequency response arising from normal variation in integrated circuit processing, thereby destroying the close matching required between them. Precision components external to the IC chip are used in the art to solve this problem. Also, because the discrete-time filter components 10 & 12 follow instead of precede the reconstruction filter, both signals 14 & 16 contain unwanted high-frequency components generated by the digital operations in filters 10 & 12, necessitating even more filters later in the system (not shown).

In U.S. Pat. No. 5,051,702, Kiyoshi Iwasaki discloses an automatic phase controlling circuit that employs a narrow-band 90-degree phase shifter for biasing the feedback loop used to control phase. Iwasaki neither considers nor suggests a method for providing accurate 90 degree phase shifts over a broad frequency band.

In U.S. Pat. No. 2,905,837, G. H. Barry discusses an early phase modulation discriminator design that relies on fixed phase shifts between subsequent signal pulses to encode information. However, Barry limits his disclosure to narrow-band operation and neither considers nor suggests precise phase control over a wide frequency band.

In U.S. Pat. No. 4,968,908, Fred L. Walls discloses a method and apparatus for wideband phase modulation and discloses a phase modulator that couples a small portion of an input signal to an amplitude modulator and phase shifter to shift the small signal portion by exactly 90 degrees. However, Walls is concerned only with a frequency and amplitude measurement system calibration technique and his operation of wideband apparatus requires that the 90-degree phase shift be manually or automatically adjusted for any particular input carrier frequency to eliminate all mixer output amplitude variations.

Another technique known in the art for wideband signal differentiation is the active analog differentiator. Although the active differentiator does not require components external to the IC chip, it suffers from increased high-frequency noise (reduced signal-to-noise ratio) because of amplitude quantization noise introduced by the digital discrete-time differentiator components. Thus, to achieve low-noise performance, an additional filter block must be added to such active differentiator, thereby introducing unwanted external components and new equalization calibration problems.

Very recently, Laber et al. ("A 20-MHz Sixth-Order BiCMOS Parasitic-Insensitive Continuous-Time Filter and Second-Order Equalizer Optimized for Disk-Drive Read Channels", IEEE Journal of Solid-State Circuits, Vol. 28, pp. 462–470, Apr. 1993) disclose a new technique for achieving a 90-degree phase difference over a range of frequencies. Laber et al. use an integrator as the final stage of an equalizer filter and, because the integrator causes a 90-degree lag at the output relative to the input, the integrator input signal may be used as a "differentiated" version of the integrator output signal. However, the circuit disclosed by Laber et al. requires an external resistor for establishing the equalizer filter operating frequency and the bandpass output emphasizes noise from all sources at the high frequency end of the operating passband.

Accordingly, there is a clearly felt need in the art for an analog signal differentiator circuit that is suitable for monolithic IC implementation over a broad frequency band without external components. The related unresolved problems and deficiencies are clearly felt in the art and are solved by this invention in the manner described below.

SUMMARY OF THE INVENTION

The circuit of this invention provides two analog signals having an accurate 90-degree phase shift between them from a single sampled-data input signal without the need for components external to a monolithic IC embodiment. This result is achieved by combining two simple discrete-time signals to achieve the required signal differentiation.

It is an object of this invention to provide two output analog signals having a 90-degree phase relationship over a wide frequency band. It is another object of this invention to provide a phase shift circuit that is insensitive to IC process variations without for the need for external components.

It is an advantage of the circuit of this invention that the discrete-time circuit timing signals are derived from a precision oscillator, thereby eliminating the effects of IC process variations on phase shifter performance. It is another advantage of the circuit of this invention that the simple signal differentiation provides a reliable 90-degree phase shift at each frequency in the operating band.

The foregoing, together with other objects, features and advantages of this invention, will become more apparent when referring to the following specification, claims and the accompanying drawing.

BRIEF DESCRIPTION OF THE DRAWINGS

For a more complete understanding of this invention, reference is now made to the following detailed description of the embodiments as illustrated in the accompanying drawing, wherein.

DESCRIPTION OF THE PREFERRED EMBODIMENTS

Figure 1:
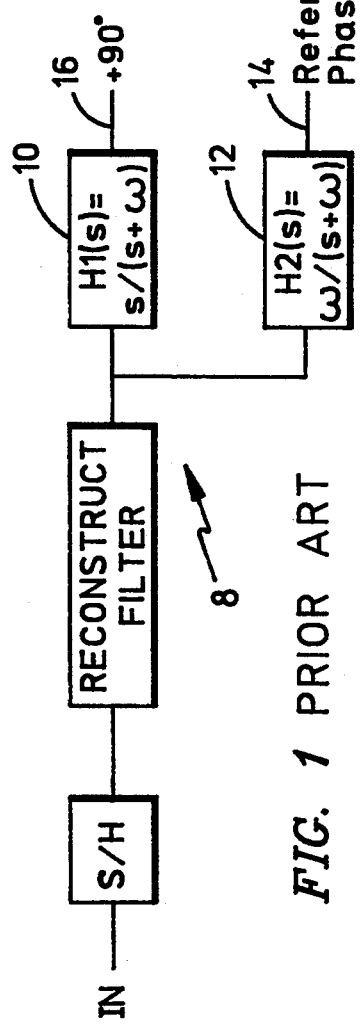
FIG. 1 shows a functional block diagram of an illustrative 90-degree phase shifter from the prior art with external components.
Figure 2:
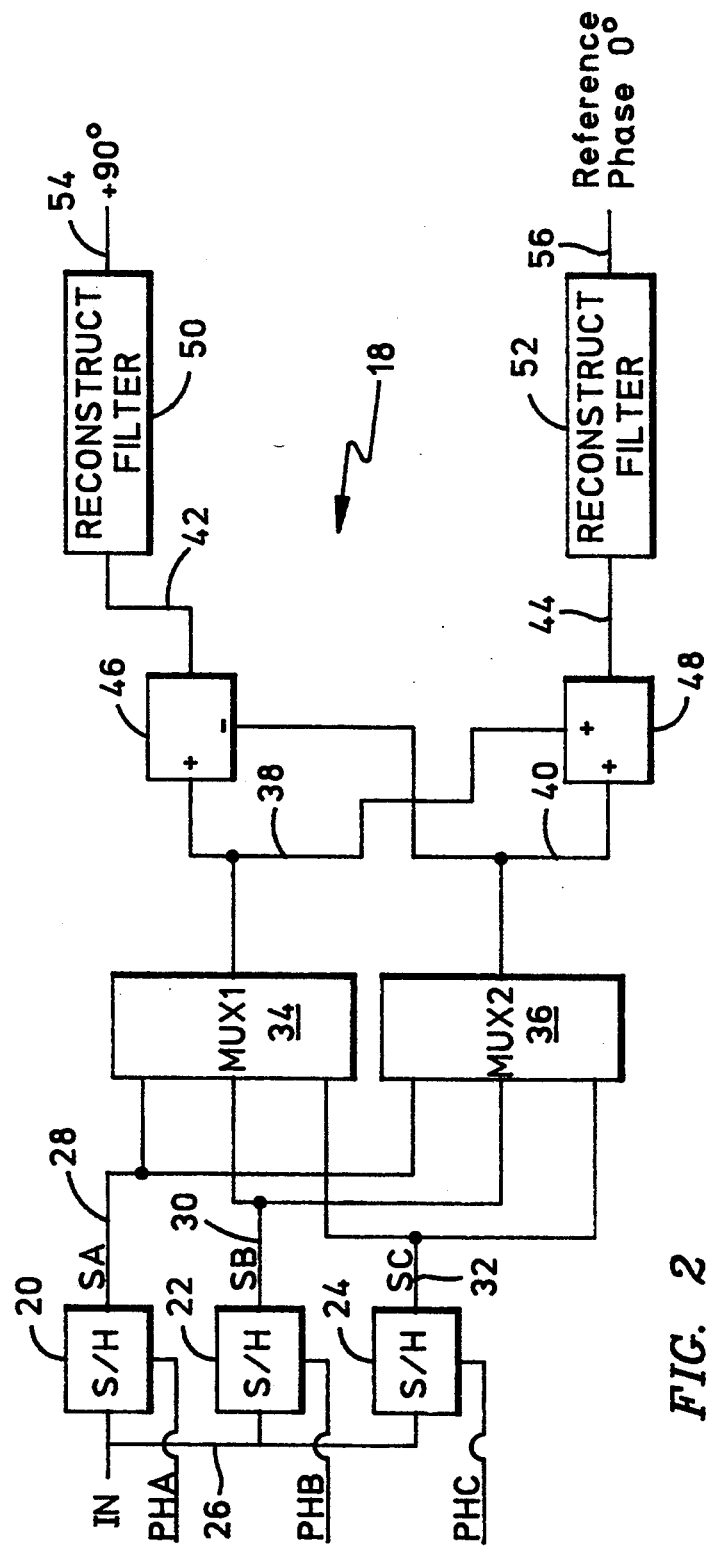
FIG. 2 shows a functional block diagram of a preferred embodiment of the 90-degree phase shifter of this invention.

FIG. 2 shows a functional block diagram of the 90-degree phase shifter circuit of this invention. For purposes of illustration, phase shifter circuit 18 is shown with the three sample-and-hold (S/H) circuits 20, 22, and 24. Each S/H circuit 20, 22, and 24 has an input connected to analog input signal 26 and an output representing the "holding" value of the present sample and may be implemented in any useful manner known in the art.

Figure 3:
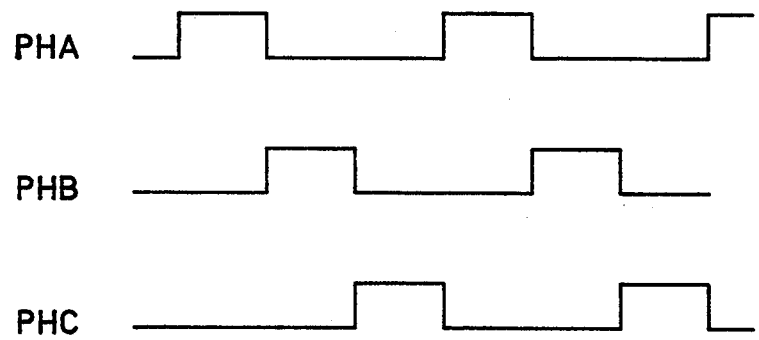
FIG. 3 shows the waveforms of an illustrative 3-phase sampling clock suitable for use with the phase shifter of FIG. 2.
Figure 6:
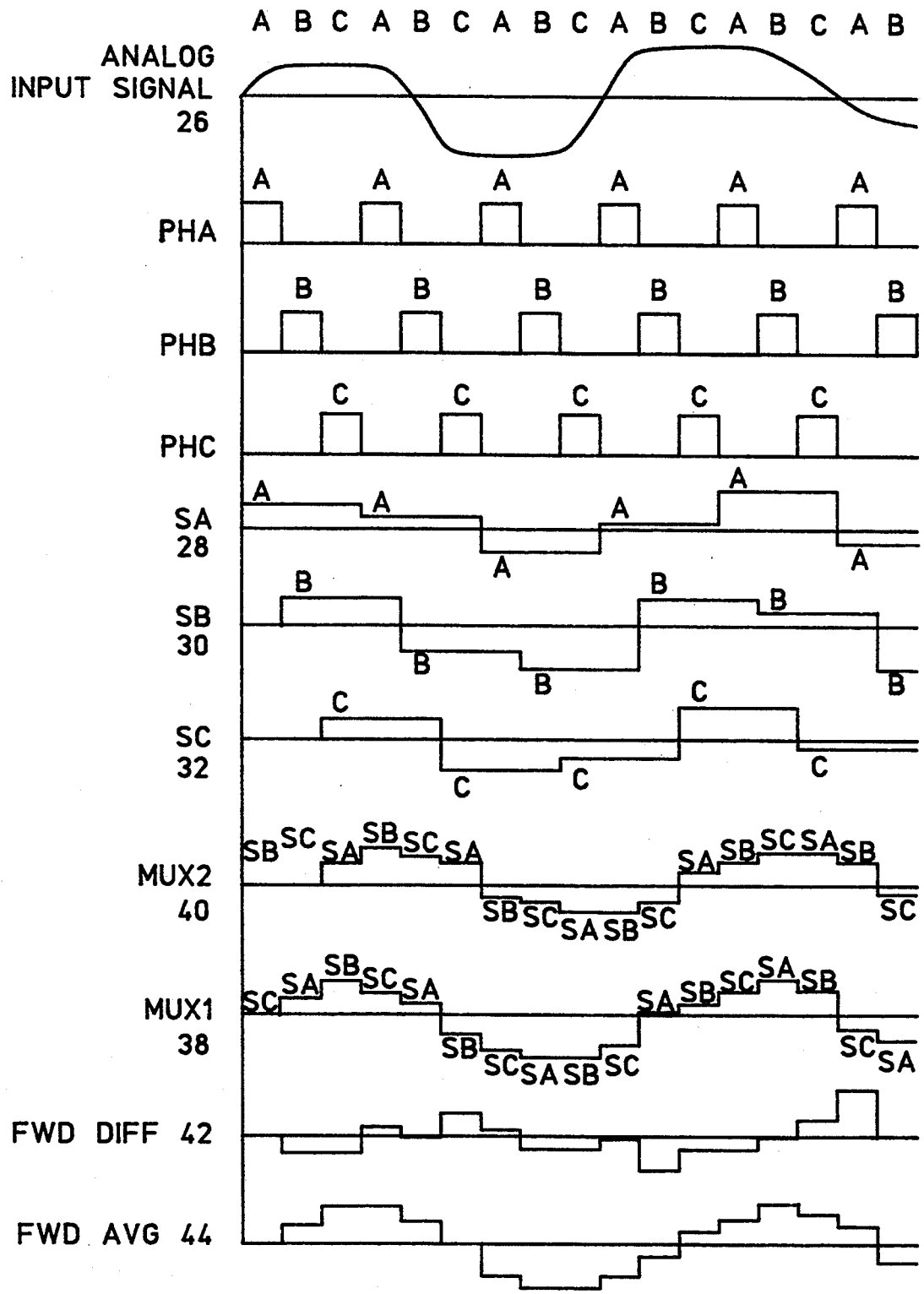
FIG. 6 illustrates selected signal waveforms associated with the operation of the phase shifter of FIG. 2.

Each S/H circuit 20, 22, and 24 operates in the same fashion, which may be understood from the following discussion of S/H circuit 20. In response to the sampling clock signal waveform PHA such as shown in FIG. 3, S/H circuit 20 samples the value of signal 26 and holds that value continuously at output 28 until again sampling the value of signal 26 responsive to the next sampling clock pulse. The typical waveform at output 28 is shown in FIG. 6.

FIG. 3 shows a three-phase clock having the three individual sampling clock waveforms PHA, PHB and PHC. Each clock waveform is delayed in phase by one-third of the sampling clock interval in a fashion well-known in the art for multiphase clocks. Referring to the three-phase clock of FIG. 3 and to the three S/H circuits 20, 22, and 24 of FIG. 2, output signal 28 represents the sample SA of analog signal 26 taken in response to the sampling clock PHA. Similarly, the output signal 30 of S/H circuit 22 represents the sample SB of analog input signal 26 taken responsive to the sampling clock PHB and output signal 32 of S/H circuit 24 represents the sample SC associated with sampling clock PHC. Exemplary waveforms of these several output signals and sampling clocks are represented in FIG. 6.

The three output signals SA 28, SB 30 and SC 32 are all presented to two multiplexors 34 and 36. Multiplexors 34 and 36 are also driven by the three phase clock signals of the FIG. 3 (not shown in FIG. 2) in a manner that sequentially couples each of the three multiplexor inputs to a multiplexor output. For instance, multiplexor 34 sequentially connects SA 28, SB 30 and SC 32 to the output 38. Multiplexor 36 similarly connects the three sample signals 28, 30 and 32 to an output 40. The usefulness of output signals 38 and 40 can be understood from the following discussion.

The three S/H circuits 20, 22 and 24 the two multiplexors 34 and 36 in FIG. 2 operate to produce delayed discrete-time versions of analog input signal 26. Output signal 38 can be described according to the following Eqn. 3:

$$MUX1 = (SA \times PHB) + (SB \times PHC) + (SC \times PHA) \quad \text{[Eqn. 3]}$$

as exemplified by MUX1 38 in FIG. 6.

Similarly, output signal 40 can be described according to the following Eqn. 4:

$$MUX2 = (SA \times PHC) + (SB \times PHA) + (SC \times PHB) \quad \text{[Eqn. 4]}$$

as exemplified by MUX2 40 in FIG. 6.

FIG. 6 shows that output signal 40 represents a once-delayed discrete-time version of analog signal 26 and output signal 38 represents an undelayed discrete-time version of analog input signal 26. Because S/H circuits 20, 22 and 24 are clocked in parallel, as are multiplexors 34 and 36 output signals 38 and 40 are not subject to the usual build-up of sampling errors known in the art for multistage sample-and-hold implementations.

If the difference between output signal 38 and output signal 40 is taken, a forward difference signal 42 is obtained that can be written in z-transform form as:

$$(1 - z^{-1}) \quad \text{[Eqn. 5]}$$

If the output signals 38 and 40 are summed, a forward average signal 44 is obtained that can be written in z-transform form as:

$$(1 + z^{-1}) \quad \text{[Eqn. 6]}$$

The characteristics of discrete-time signals in z-transform notation may be understood with reference to any reputable treatise such as that by Alan V. Oppenheim, et al. (*Discrete-Time Signal Processing*, Ch. 4, "The Z-Transform," pp. 149–201, Prentice Hall, Englewood Cliffs, N.J. 1989). As is commonly understood in the art, the phase difference between forward difference signal 42 and forward average signal 44 is always precisely 90 degrees. Because the sample signals SA 28, SB 30 and SC 32 are derived from a three-phase clock signal controlled by a precision oscillator and because of the absence of sampling error buildup, the precise output magnitudes from a forward averaging circuit 46 and a forward averaging circuit 48 are insensitive to variations in integrated circuit process parameters.

Figure 5:
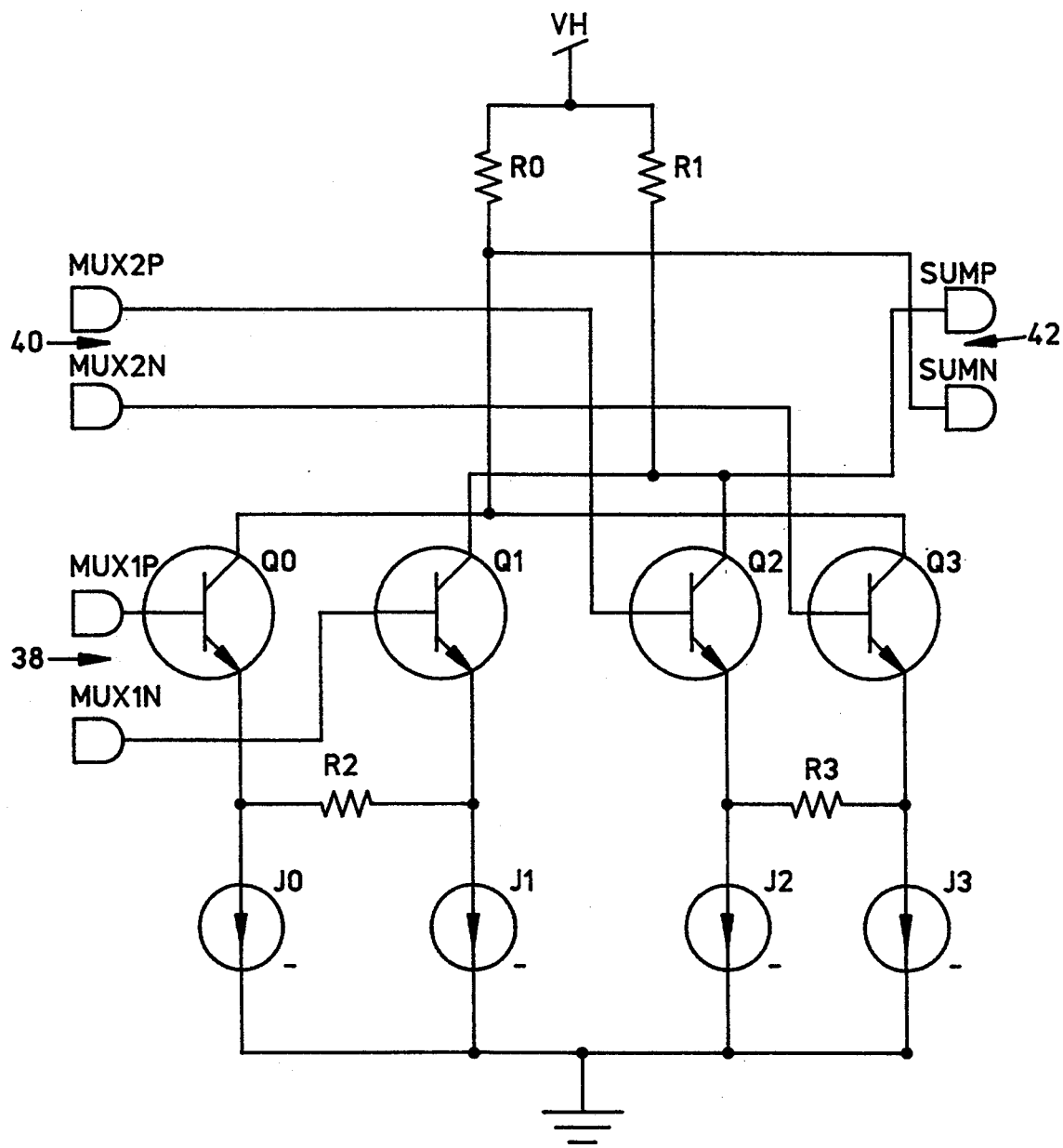
FIG. 5 is an illustrative embodiment of a differential subtraction circuit suitable for use as the forward differencing circuit of FIG. 2.

In FIG. 2, forward differencing circuit 46 subtracts output signal 40 from output signal 38 to yield forward difference signal 42. FIG. 5 provides an exemplary embodiment of a differential amplifier suitable for use as forward differencing circuit 46 in FIG. 2. The differential amplifier in FIG. 5 functions by adding the positive side of differential output signal 40 to the negative side of differential output signal 38 to produce forward difference signal 42 as shown.

Figure 4:
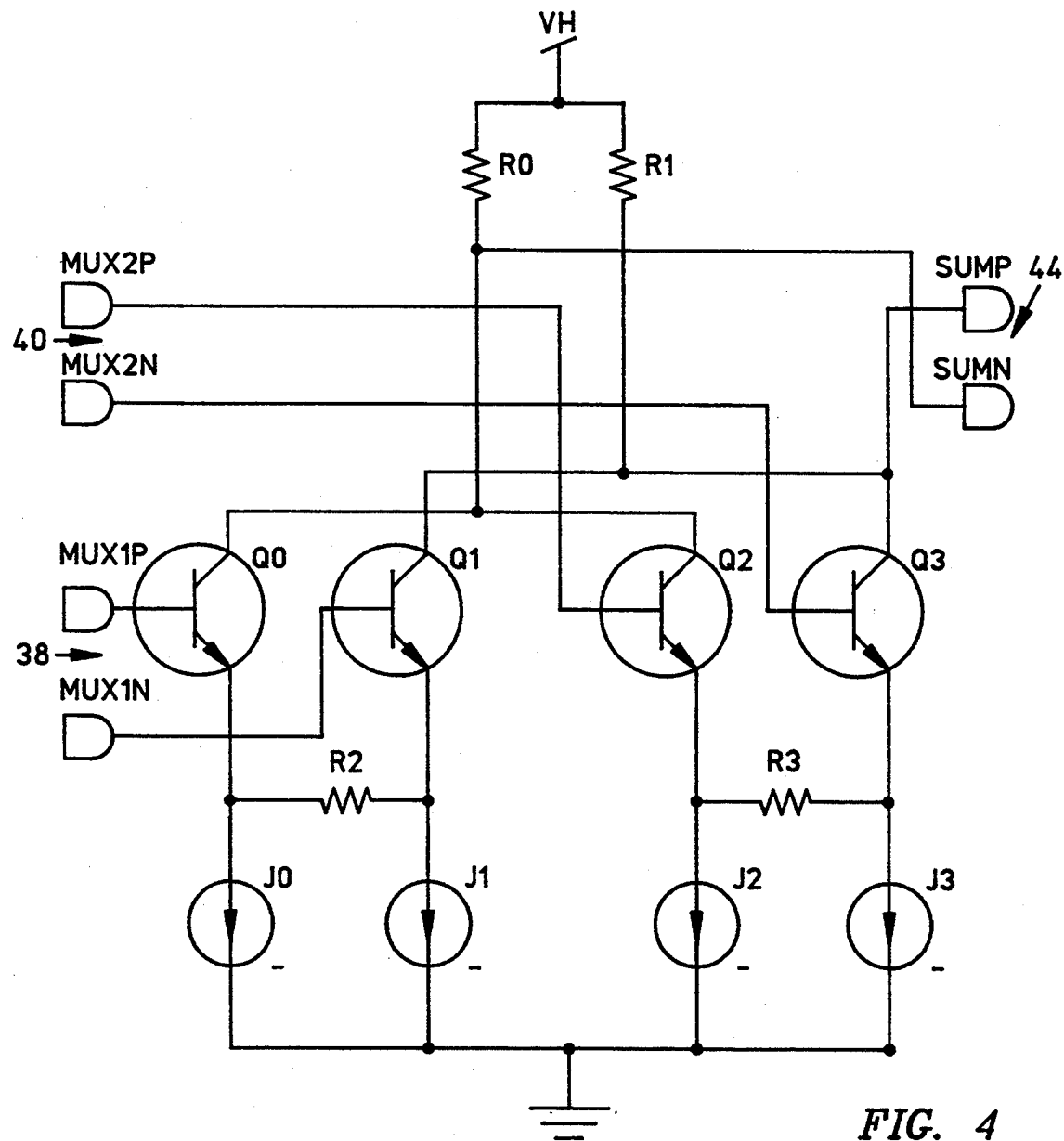
FIG. 4 is an illustrative embodiment of a differential summing circuit suitable for use as the forward averaging circuit of FIG. 2.

Similarly, forward averaging circuit 48 adds output signal 40 to output signal 38 to yield forward average signal 44. FIG. 4 shows an exemplary differential amplifier suitable for use for forward averaging circuit 44 in FIG. 2. The differential amplifier in FIG. 4 adds the positive sides of the two differential multiplexor output signals 38 and 40 to create forward average signal 44 as shown.

Returning to FIG. 2, forward average signal 44 and forward difference signal 42 are presented to reconstruction filters 50 and 52, respectively, to remove the spurious frequency components introduced by the discrete-time sampling operations. Reconstruction filters 50-52 are preferably multipole low-pass filters having matched transfer characteristics. The analog output signal 54 from reconstruction filter 50 represents the first of two output signals in quadrature and is always 90 degrees ahead of the reference phase of the second quadrature signal at output 56. Because sample-and-hold circuits 20, 22 and 24 multiplexors 34 and 36 generate some high-frequency sampling noise, the placement of reconstruction filters 50 and 52 following the forward difference circuit 56 and forward average circuit 48 result in limiting and reducing the high-frequency noise output normally associated with signal differential circuits known in the art. Reconstruction filters 50 and 52 serve both to reject high-frequency sampling images present in signals 42 and 44 and to reduce high-frequency noise in the quadrature output signals 54 and 56.

Clearly, other embodiments and modifications of this invention will occur readily to those of ordinary skill in the art in view of these teachings. Therefore, this invention is to be limited only by the following claims, which include all such embodiments and modifications when viewed in conjunction with the above specification and accompanying drawing.

We claim:

1. A phase shifting circuit for differentiating an analog data signal to produce two analog quadrature signals separated from one another by a 90-degree phase shift, said circuit comprising:

input means for accepting said analog data signal;

multiphase clock input means for accepting a plurality N of sampling clock signals each having a fixed sampling interval $T_s$ and a fixed repetition rate $F_s=1/T_s$, wherein said sampling clock signals are offset from one another in time by one or more phase intervals $T_p=T_s/N$, wherein $N>1$ is a positive integer;

a plurality N of sample-and-hold means coupled to said input means and to said multiphase clock input means, each said sample-and-hold means being for sampling and holding the value of said analog data signal responsive to a corresponding one of said plurality N of said sampling clock signals;

two multiplexor means each having a multiplexor output and a plurality N of inputs each coupled to a corresponding one of said plurality N of sample-and-hold means, said each multiplexor means disposed for connecting one of said plurality N of sample-and-hold means to its multiplexor output responsive to a corresponding one of said plurality N of sampling clock signals;

forward averaging means coupled to said two multiplexor means for adding the signals at said multiplexor outputs to create a forward average signal corresponding to a first said analog quadrature signal; and forward differencing means coupled to said two multiplexor means for subtracting the signals at said multiplexor outputs to create a forward difference signal corresponding to a second said analog quadrature signal.

2. The phase shifting circuit of claim 1 wherein $N=3$.

3. The phase shifting circuit of claim 2 further comprising:

first filtering means coupled to said forward averaging means for removing some frequency components from said forward average signal to produce said first analog quadrature signal; and second filtering means coupled to said forward differencing means for removing some frequency components from said forward difference signal to produce said second analog quadrature signal.

4. The phase shifting circuit of claim 3 wherein said first and second filtering means each include a multipole low-pass filter circuit, said multipole low-pass filter circuits being substantially identical.

5. The phase shifting circuit of claim 4 wherein said circuit is implemented as a monolithic integrated circuit.

6. The phase shifting circuit of claim 1 wherein said forward averaging means and said forward differencing means each include a differential analog amplifier circuit.

7. The phase shifting circuit of claim 6 wherein $N=3$.

8. The phase shifting circuit of claim 7 wherein said circuit is implemented as a monolithic integrated circuit.

9. The phase shifting circuit of claim 1 further comprising: first filtering means coupled to said forward averaging means for removing some frequency components from said forward average signal to produce said first analog quadrature signal; and second filtering means coupled to said forward differencing means for removing some frequency components from said forward difference signal to produce said second analog quadrature signal.

10. The phase shifting circuit of claim 9 wherein said first and second filtering means each include a multipole low-pass filter circuit, said multipole low-pass filter circuits being substantially identical.

11. The phase shifting circuit of claim 1 wherein said circuit is implemented as a monolithic integrated circuit.

12. The phase shifting circuit of claim 11 wherein $N=3$.

* * * * *